United States Patent
Chen et al.

(10) Patent No.: US 9,354,816 B2
(45) Date of Patent: May 31, 2016

(54) READ POLICY FOR SYSTEM DATA OF SOLID STATE DRIVES

(71) Applicant: Seagate Technology LLC, Cupertino, CA (US)

(72) Inventors: Zhengang Chen, San Jose, CA (US); Gordon J. Coleman, Los Altos, CA (US); Earl T. Cohen, Cupertino, CA (US); Ivana Djurdjevic, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 100 days.

(21) Appl. No.: 14/269,590

(22) Filed: May 5, 2014

(65) Prior Publication Data

US 2015/0286421 A1   Oct. 8, 2015

Related U.S. Application Data

(60) Provisional application No. 61/976,854, filed on Apr. 8, 2014.

(51) Int. Cl.
*G11C 29/00* (2006.01)
*G06F 3/06* (2006.01)
*H03M 13/11* (2006.01)

(52) U.S. Cl.
CPC ............ *G06F 3/0617* (2013.01); *G06F 3/0632* (2013.01); *G06F 3/0679* (2013.01); *H03M 13/1108* (2013.01)

(58) Field of Classification Search
CPC ....... G06F 11/2268; G06F 8/665; G06F 9/24; G06F 9/4401; G06F 11/1004; G06F 12/0866; G06F 12/0893; G06F 12/0873; G06F 11/1072; G06F 11/1068; G06F 3/0617; G06F 3/0632; G06F 3/0679; G11C 29/88; G11C 16/10; H03M 13/095; H03M 13/09; H03M 13/1108
See application file for complete search history.

(56) References Cited

U.S. PATENT DOCUMENTS

| | | | |
|---|---|---|---|
| 8,120,990 B2* | 2/2012 | Kim | G11C 7/1045 365/185.11 |
| 9,146,824 B1* | 9/2015 | Chen | G06F 11/2268 |
| 2007/0133281 A1* | 6/2007 | Fujita | G11C 16/10 365/185.05 |
| 2008/0086631 A1* | 4/2008 | Chow | G06F 8/665 713/2 |
| 2010/0191944 A1 | 7/2010 | Numata et al. | 713/1 |
| 2011/0066837 A1* | 3/2011 | Lee | G06F 9/4401 713/2 |
| 2012/0066546 A1 | 3/2012 | Kim | 714/15 |
| 2012/0272033 A1 | 10/2012 | Murphy et al. | 711/171 |
| 2012/0311279 A1 | 12/2012 | Hong et al. | 711/162 |
| 2013/0024682 A1 | 1/2013 | Dolgunov et al. | 713/100 |
| 2013/0042095 A1* | 2/2013 | Jung | G06F 9/24 713/2 |
| 2013/0047031 A1 | 2/2013 | Tabone et al. | 714/15 |
| 2013/0111308 A1* | 5/2013 | Sauber | H03M 13/095 714/807 |

* cited by examiner

*Primary Examiner* — Guerrier Merant
(74) *Attorney, Agent, or Firm* — Christopher P. Maiorana, PC

(57) ABSTRACT

An apparatus includes a plurality of memory dies and a controller. The controller may be communicatively coupled to the plurality of memory dies and configured to utilize multiple copies of a root record containing system data during a boot-up process. The multiple copies of the root record are stored using at least two of the plurality of memory dies.

20 Claims, 5 Drawing Sheets

READ POLICY FOR SYSTEM DATA OF SOLID STATE DRIVES

This application relates to U.S. Provisional Application No. 61/976,854, filed Apr. 8, 2014, which is hereby incorporated by reference in its entirety.

FIELD OF THE INVENTION

The invention relates to storage systems generally and, more particularly, to a method and/or apparatus for implementing a read policy for system data of solid state drives or disks (SSDs).

BACKGROUND

When a solid state drive or disk (SSD) boots up from a power-off state, a hibernation state, or other low-power states, a runtime environment needs to be loaded by an SSD controller for the SSD to enter normal operations. Typically, a small start-up program is stored in a read-only memory (ROM), which is shipped with the drive. Since ROM is read-only, the start-up program can only load pre-defined system data (referred to herein as a root record) from fixed (pre-defined) locations in a non-volatile media (NVM), such as flash memory, of the SSD. The data in the fixed location may refer to other system data such as a map, an operating system, etc. Flash memory suffers from various sources of noise such as program/erase wear, retention, read disturb, etc. Error correction codes (ECC) are used to protect data stored in flash. The SSD controller needs to be able to correctly read the root record almost all the time. If any read fails, the drive is said to have "bricked" (i.e., become inaccessible). Solid state drives or disks (SSDs) use conventional BCH (Bose Chaudhuri Hocquenghem) codes as the primary ECC. As newer generations of multi-level cell (MLC) flash memory (e.g., sub-20 nm) as well as tri-level cell (TLC) flash memory emerge as more cost-efficient choices for SSDs, low density parity check (LDPC) codes are becoming the ECC of choice. However, several new problems arise with the use of LDPC codes and smaller geometries. For a controller to support multiple types of flash memories from multiple vendors, including all flash-specific (non-standard) commands/information into the ROM is difficult. Also, the ROM cannot support new flash commands/information that may be introduced after the ROM is constructed. Examples of such non-standard commands/information include soft read related commands and flash page layout in a block (e.g., which pages are lower page and which pages are upper pages in an MLC device). Soft read related commands are needed to support soft-decision LDPC (SLDPC) decoding. Due to this limitation, supporting SLDPC in reading the root record is difficult. In addition, read disturb noise is more severe on flash memory of smaller geometry. LDPC codes have an error floor. Depending on the code and the decoding algorithm, the error floor can vary. Typically, hard-decision LDPC (HLDPC) decoding leads to a higher error floor than soft-decision LDPC (SLDPC) decoding. The error floor can be as high as a 1e−6 codeword failure rate if the code is weaker, less optimized or a weaker HLDPC decoder is used. In addition, read disturb noise is more severe on flash memory of smaller geometry. Another noise/failure mechanism is block failure. A block may fail as usage of the block increases or due to other factors such as environmental radiation. When a block that contains the root record fails, no ECC can help.

It would be desirable to have a method and/or apparatus for implementing a read policy for system data of solid state drives or disks (SSDs).

SUMMARY

The invention concerns an apparatus including a plurality of memory dies and a controller. The controller may be communicatively coupled to the plurality of memory dies and configured to utilize multiple copies of a root record containing system data during a boot-up process. The multiple copies of the root record are stored using at least two of the plurality of memory dies.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a read policy for system data of solid state drives or disks (SSDs) that may (i) apply to a wide range of flash memories and SSD configurations, (ii) ensure root record block reliability in lower-die count configurations, (iii) lower an error floor to negligible levels without involving soft-decision LDPC, (iv) minimize read disturb on root record blocks, and/or (v) be implemented using one or more integrated circuits.

Figure 1:
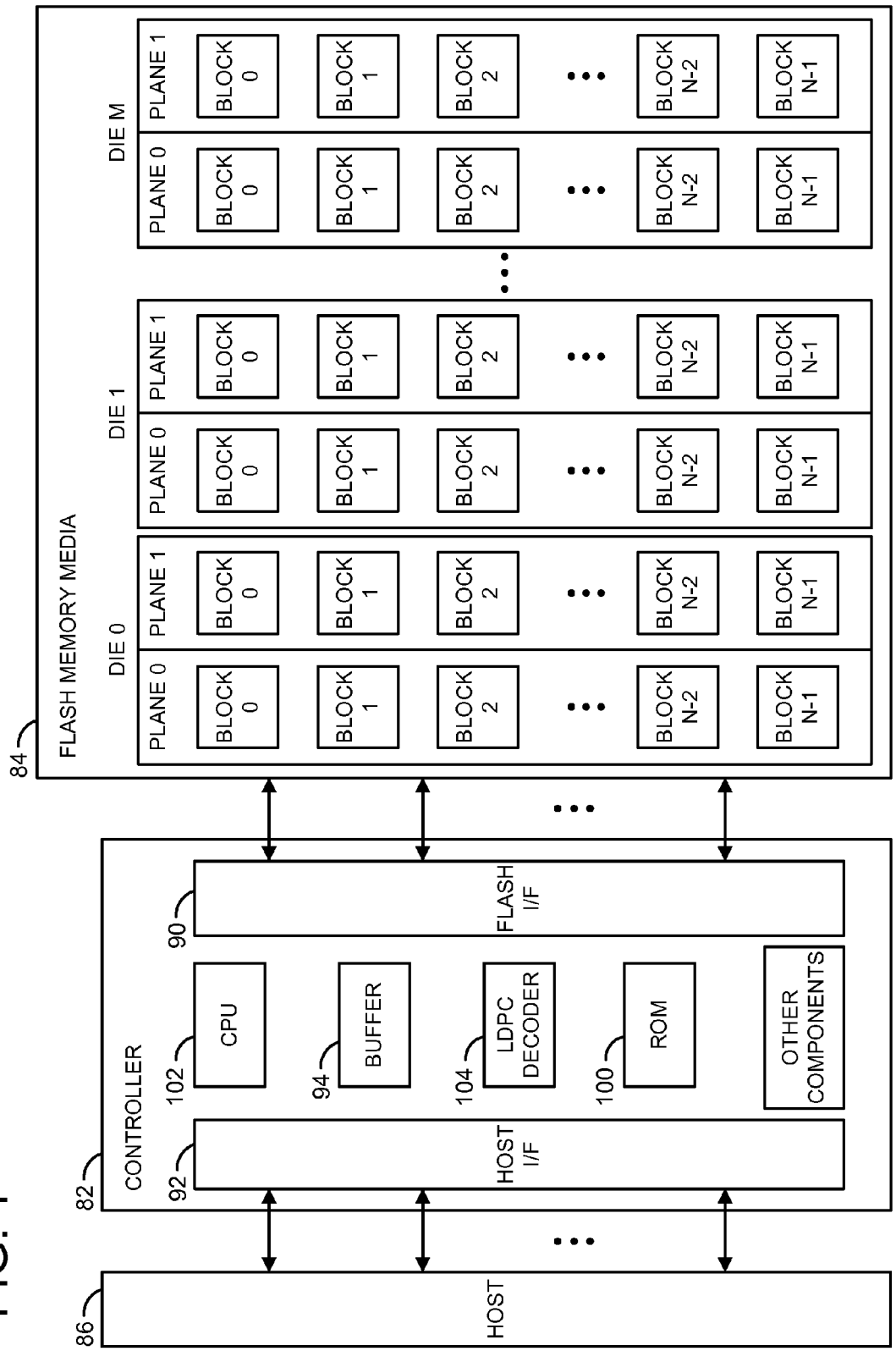
FIG. 1 is a diagram illustrating an example system model in accordance with an embodiment of the invention.

Referring to FIG. 1, a diagram is shown illustrating a non-volatile memory system 80 in accordance with an embodiment of the invention. In various embodiments, the non-volatile memory system 80 comprises a block 82, a block 84, and a block 86. The block 82 comprises a memory controller implementing a read operation policy for system data during a boot-up process in accordance with an embodiment of the invention. The block 84 comprises a non-volatile memory (NVM) media. The block 86 comprises a host. In various embodiments, the blocks 82 and 84 implement a solid-state drive or disk (SSD).

The controller 82 may be configured to control one or more individual non-volatile memory lanes. In some embodiments, the controller 82 may implement multiple memory lane controller instances to control a plurality of non-volatile memory lanes. The controller 82 has a non-volatile memory interface 90 configured to couple the controller 82 to the non-volatile memory media 84. The non-volatile memory media 84 comprises a plurality of memory dies (e.g., DIE 0, DIE 1, ..., DIE M). The plurality of memory dies may be implemented as one or more non-volatile memory devices (or packages). According to a type of a particular one of the non-volatile memory devices, the non-volatile memory dies in the particular non-volatile memory device are optionally and/or selectively accessible in parallel. The non-volatile memory dies DIE 0, DIE 1, . . . , DIE M are generally representative of one type of storage device enabled to communicatively couple to the controller 82. However, in various embodiments, any type of storage device is usable, such as SLC (single level cell) NAND flash memory, MLC (multi-level cell) NAND flash memory, TLC (triple level cell) NAND flash memory, 1z flash memory, 3D flash memory, NOR flash memory, magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of non-volatile memory device or storage medium.

In some embodiments, the controller 82 and the non-volatile memory media 84 are implemented on separate integrated circuits. When the controller 82 and the non-volatile memory media 84 are implemented as separate integrated circuits (or devices), the non-volatile memory interface of the controller 82 is generally enabled to manage a plurality of data input/output (I/O) pins and a plurality of control I/O pins. The data I/O pins and the control I/O pins may be configured to connect the device containing the controller 82 to the external device(s) forming the non-volatile memory media 84. In various embodiments, the controller 82 is implemented as an embedded controller. In various embodiments, the controller 82 and the NVM media 84 implement a solid-state drive or disk (SSD).

The controller 82 also has a command interface 92 configured to receive commands and send responses to the host 86. In embodiments implementing a plurality of non-volatile memory lanes, the controller 82 also includes multiplexing circuitry coupling the multiple instances of memory lane controllers to circuitry (e.g., a back-end processing unit) providing scheduling and/or data management of the plurality of non-volatile memory devices and/or dies. In various embodiments, the controller 82 comprises data buffering and direct memory access (DMA) engines to store data or other information and to move the data or other information between the host 86 and the NVM media 84 using one or more memory lane controllers within the controller 82.

When a non-volatile memory read operation is performed (e.g., in response to a request originating either externally from the host or internally from the controller) raw data is retrieved from the NVM media 84. To ensure the data returned is correct, various ECC codes can be used, such as BCH (Bose Chaudhuri Hocquenghem) codes, LDPC (low-density parity-check) code, turbo codes, polar codes, and convolutional codes. The ECC decoding may operate on the granularity of a codeword (of fixed or variable size), referred to as an e-page. Under normal conditions, the ECC decoding can correct errors in the raw e-page using on-the-fly (or dynamic) decoding and return the corrected e-page (and/or other requested data, such as statistics) immediately (e.g., via a buffer 94). In such cases, the read operation for the particular e-page is considered complete. The controller 82 can perform various retry tasks when on-the-fly read decoding fails.

In various embodiments, the controller 82 includes a circuit 100 that enables the read operation policy for system data during boot-up functionality. In various embodiments, the circuit 100 may be implemented as a read-only memory (ROM) embodying instructions for controlling a processing unit (e.g., CPU 102) of the controller 82 during booting operations. However, other types of non-volatile memory devices may be used to implement the circuit 100 (e.g., flash memory, write once memory (WOM), one time programmable (OTP), etc.). In various embodiments, the ROM 100 is implemented within the controller 82. In some embodiments, the ROM 100 resides within the SSD but external to the controller 82. To ensure the system data returned by a read operation is correct, an LDPC decoder 104 may be configured to perform hard-decision LDPC decoding during boot-up operations. The LDPC decoder 104 may be part of a broader ECC decoding functionality of the controller 82.

In some embodiments, the LDPC decode 104 can be enabled to perform both hard-decision and soft-decision LDPC decoding. For example, in some instances, prior to successfully reading root record data, the controller 82 may be enabled to use the LDPC decoder 104 to perform only hard-decision decoding. Once the root record data is successfully read, the controller 82 may enable the LDPC decoder 104 to perform both hard- and soft-decision decoding. For example, the controller 82 may be configured to begin with hard-decision decoding of user data stored in the non-volatile memory media 84 and, if the hard-decision decoding fails, perform soft-decision decoding on the failed user data.

In various embodiments, a SSD boot procedure can be divided into several distinct steps: ROM boot, full hardware (HW) initialization, map recovery, ensure sufficient reserved blocks to run normal operations, and communicate the operational status to the host. In various embodiments, the ROM boot is done by firmware, located in the ROM 100. In one example, the ROM boot step may comprise (i) initializing part of the SSD HW necessary for a next step (e.g., ability to perform NVM read operations will be needed at least), (ii) find a root record (e.g., in a system data area) containing a firmware image, (iii) load the firmware image and (iv) start executing the firmware. The step of communicating the operational status to the host 86 and the previous steps starting from full HW initialization are done by the firmware loaded in the first step. After the full HW initialization, the controller 82 is fully functional from a hardware perspective including having the ability to communicate with the host 86.

An SSD is composed of the storage media, the controller, and other peripheral components. In various embodiments, the non-volatile memory media 84 is implemented as NAND flash memory. The flash memory is typically organized as a hierarchy of units, such as die, plane, block, and page. To store host data on the drive, the controller 82 manages the mapping between host-side logical block addresses (LBA) and flash-side physical addresses. The mapping may change throughout the lifetime of the drive due to garbage collection, wear leveling, and other data movement operations deemed necessary by the controller 82.

Figure 2:
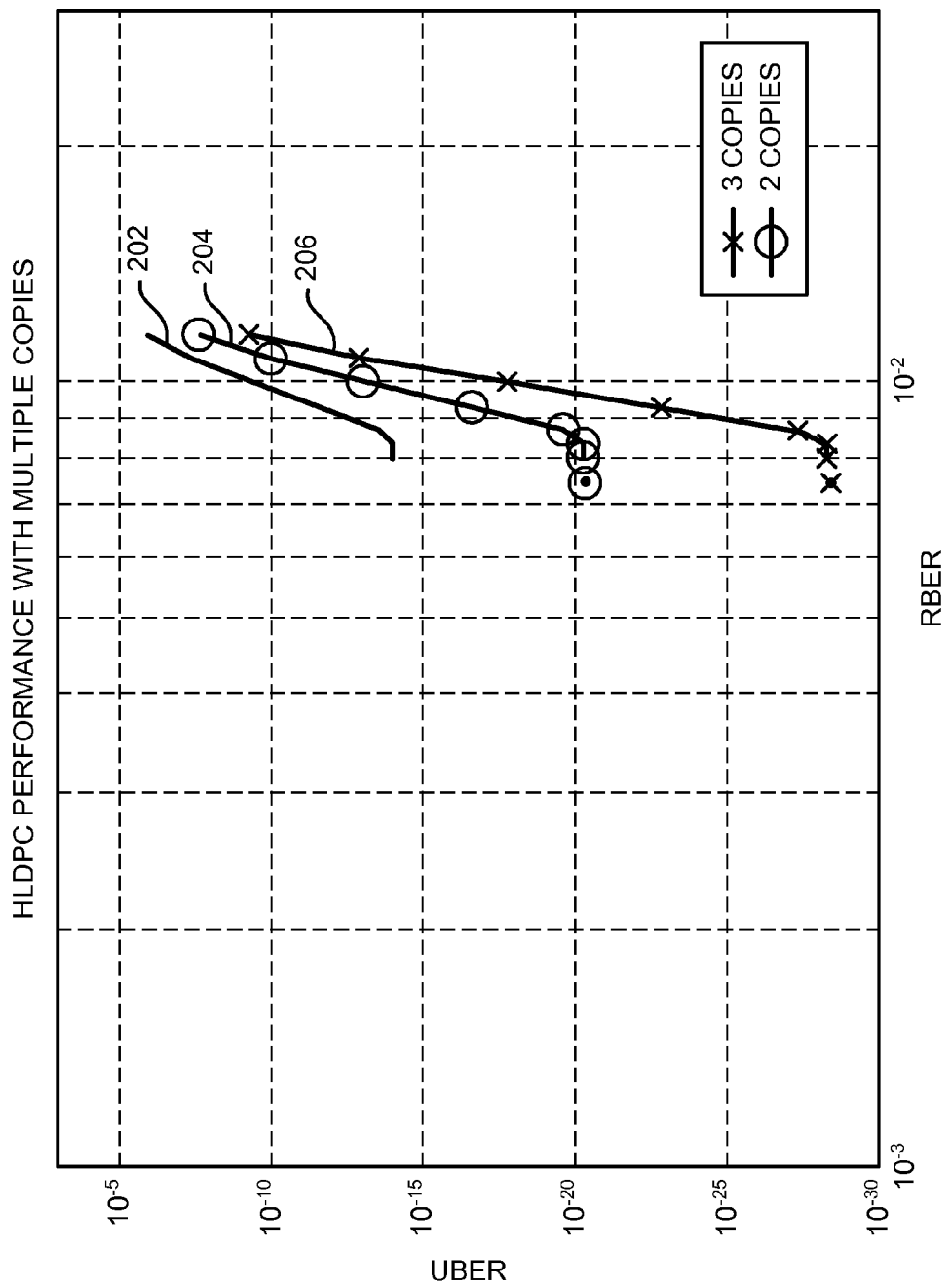
FIG. 2 is a diagram illustrating hard-decision low density parity check (HLDPC) performance with multiple independent root record copies.

Referring to FIG. 2, a diagram is shown illustrating a comparison between ECC performance of a conventional system and a system implementing a read policy in accordance with an embodiment of the invention. Solid state drives or disks (SSDs) use BCH as the primary ECC. As newer generations of multi-level cell (MLC) flash memory (e.g., sub-20 nm) as well as tri-level cell (TLC) flash memory emerge as more cost-efficient choices for SSDs, low density parity check (LDPC) codes are becoming the ECC of choice. However, several new problems arise with the use of LDPC codes and smaller geometries. For a controller to support multiple types of flash memories from multiple vendors, including all flash-specific (non-standard) commands/information into the ROM is difficult. Also, the ROM cannot support new flash commands/information that may be introduced after the ROM is constructed. Examples of such non-standard commands/information include soft read related commands and flash page layout in a block (e.g., which pages are lower page and which pages are upper pages in an MLC device). Soft read related commands are needed to support soft-decision LDPC (SLDPC) decoding. Due to this limitation, supporting SLDPC in reading the root record is difficult. In addition, read disturb noise is more severe on flash memory of smaller geometry.

LDPC codes have an error floor, which is a change of slope in the ECC performance curve in a high signal-to-noise ratio (SNR), or low raw bit error rate (RBER) region. Depending on the code and the decoding algorithm, the error floor can vary. Typically, hard-decision LDPC (HLDPC) decoding leads to a higher error floor than soft-decision LDPC (SLDPC) decoding. FIG. 2 shows a performance curve 202 of an R=0.86 LDPC code, with hard-decision decoding. The curve 202 compares RBER and uncorrectable bit error rate (UBER), which is defined as codeword failure rate divided by user data length in the codeword, for a codeword size of 2K bytes and code rate of ~0.86. With HLDPC decoding, the error floor starts to show at an UBER around 1e−12, which corresponds to a codeword failure rate of ~1e−8. The error floor can be as high as a 1e−6 codeword failure rate if the code is weaker, less optimized or a weaker HLDPC decoder is used.

Although the error floor problem here is specifically related to HLDPC decoding, many existing error floor mitigation techniques for LDPC codes could be applied here, such as code optimization, post-processing, etc. However, any post-processing or retry techniques take extra time to recover the codeword in the error floor region. In boot-up, the latency budget is usually very stringent for SSDs, making the utilization of error floor mitigation techniques that take long latency undesirable. In various embodiments, a read operation policy is implemented that utilizes multiple independent copies of the root record to mitigate error floor. Referring again to FIG. 2, an ECC performance curve 204 is shown for the same code and decoding algorithm as the curve 202, but with 2 copies of the root record. An ECC performance curve 206 is shown for the same code and decoding algorithm as the curve 202, but with 3 copies of the root record. It can be seen that the error floor is lowered to ~1e−20 with 2 copies and to ~1e−27 with 3 copies, both significantly lower than curve 202. In some embodiments, the multiple copies of the root record are already available due to block failure considerations (described below in connection with FIG. 4). In some embodiments, the read policy implements multiple copies of the root record in every block that contains the root record in order to maintain ECC performance (e.g., error floor below target) in the event of block failures.

Figure 3:
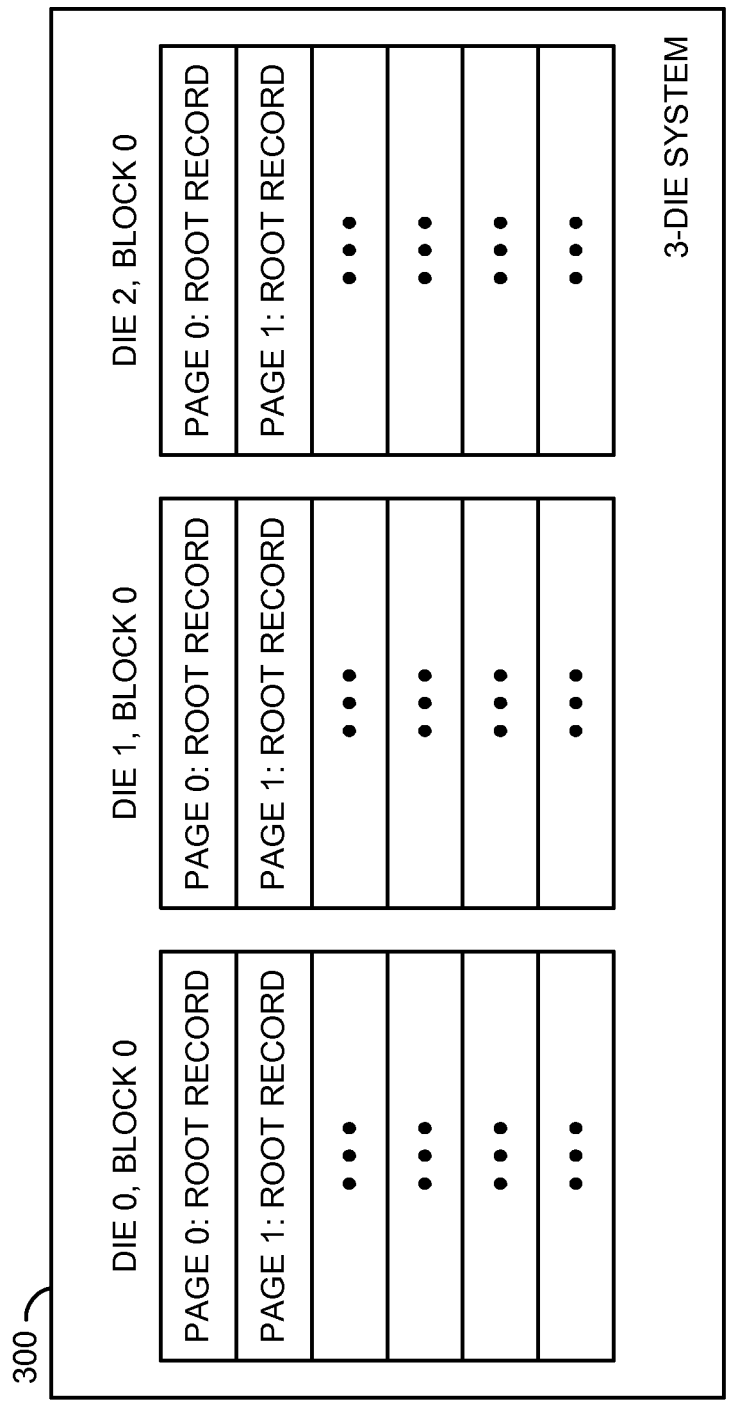
FIG. 3 is a diagram illustrating example locations of copies of root records in a 3-die system.

Referring to FIG. 3, a diagram is shown illustrating an example of storing copies of a root record in multiple flash memory blocks of a 3-die system. For the purpose of handling block failure, multiple copies of the root record can be stored in multiple blocks. The copies of the root record are spread out in different dies to avoid simultaneous failures of multiple blocks (e.g., due to die/plane failure). In embodiments implementing a 3-die system 300, block-zero from each of the 3 dies is used to store a respective copy of the root record. Within each block, at least two copies of the root record are stored (e.g., in page 0 and page 1, respectively). In some instances, more copies can be stored in a block to meet the design criteria (e.g., mitigating an error floor of hard-decision LDPC) of a particular implementation. The example shown in FIG. 3 assumes the root record can fit into a single flash page. However, more pages can be used when needed. The example shown in FIG. 3 can also be applied to system with more than three dies. In systems with more than three dies, the root record copies may be stored in, but are not limited to, dies 0,1, and 2.

The read operation is directed to fixed physical locations in the flash memory since there is no mapping involved or the mapping cannot be updated (e.g., in ROM) once the drive is shipped. Out of all blocks in a flash die, there are typically a few random blocks that are bad from beginning of life (BOL), which makes picking a fixed physical location or block number a non-trivial problem. Fortunately, flash vendors typically guarantee that block 0 is always a good block when the memory is shipped. Thus, block 0 of each of the multiple dies is generally used to store the multiple copies of the root record.

The number of blocks used to store copies of the root record can be determined by block failure rate and target root record read failure rate. For example, if the probability of a good block becoming bad in the first few program and erase cycles (the root record is rarely updated) is Pbf, and the number of blocks used is L, the probability that all blocks fail (and therefore a root record read failure occurs) is $Pbf^L$. For example, to achieve a 1e−12 root record failure rate with Pbf=1e−4, at least 3 blocks are needed.

Figure 4:
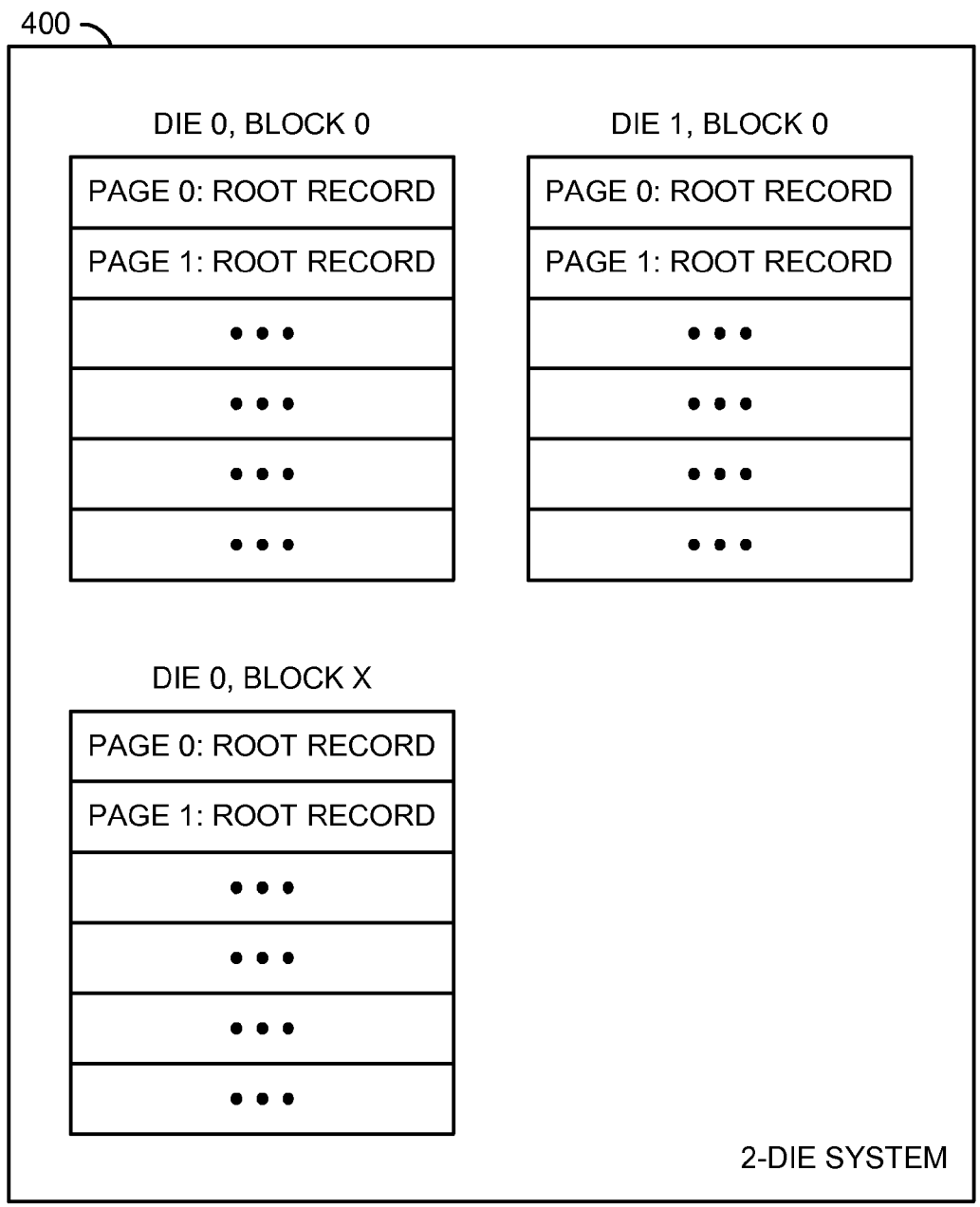
FIG. 4 is a diagram illustrating example locations of copies of root records in a 2-die system.

Referring to FIG. 4, a diagram is shown illustrating an example of storing three copies of a root record in multiple flash memory blocks of a 2-die system 400. From a controller design point of view, having one ROM program that works with all possible flash memory configurations in different SSD products is desirable, since one controller may be designed for multiple SSD products with multiple flash memory configurations. For example, one configuration may have 16 dies in the SSD, while another (low-end) product only has 2 dies in the SSD. A problem then arises, when the number of root record blocks needed is larger than the number of dies in an SSD, regarding how to choose a block that has a non-zero block number and still guarantee that the block is good (among all configurations of drives).

In various embodiments, a pool of blocks in a die are identified that have a fixed set of block addresses, and the first good block (or blocks if more than one non-zero blocks in a die are needed for root record) is picked from the pool to store the root record. The block is referred to herein as block X. In various embodiments, the read operation policy tries to read the root record block X when other copies (e.g., in block 0) have failed, without knowing which exact block is the good block that stores the copies of rood record. The root record block X has a non-zero block number.

In one example, the total number of blocks in the pool from which the block X may be chosen is K. In randomly picking a block, if the probability that the block is bad is Pbb, then the probability that there is no good block in the pool for the root record is $Pbb^K$. If K is large enough, it is almost guaranteed that the SSD has a block X to store copies of the root record. For example, if Pbb=0.01, and K=15, the probability that there is no good block X is 1e−30. Table 1 shows an example of the block X pool, chosen by setting the upper 4 bits of an 8-bit flash memory address [DQ7-DQ0] (which contains all or part of the block address) to all 15 possible non-zero values.

TABLE 1

| Block X pick/trial order | [DQ7 DQ6 DQ5 DQ4] in the block address cycle |
|---|---|
| 1 | [1 0 0 0] |
| 2 | [0 1 0 0] |
| 3 | [1 1 0 0] |
| 4 | [0 0 1 0] |
| 5 | [1 0 1 0] |
| 6 | [0 1 1 0] |

TABLE 1-continued

| Block X pick/trial order | [DQ7 DQ6 DQ5 DQ4] in the block address cycle |
|---|---|
| 7 | [1 1 1 0] |
| 8 | [0 0 0 1] |
| 9 | [1 0 0 1] |
| 10 | [0 1 0 1] |
| 11 | [1 1 0 1] |
| 12 | [0 0 1 1] |
| 13 | [1 0 1 1] |
| 14 | [0 1 1 1] |
| 15 | [1 1 1 1] |

The reason for picking the pool based on memory address bits rather than block numbers is that the same block number may have different addresses in different flash memories. The block X trial order specifies which block should be picked first to store the root record (and also be tried first in the read operation policy) if the block is good. For example, if block [1 0 0 0] is good, block [1 0 0 0] will be picked (during manufacture time) to store the root record, and the read operation policy will try block [1 0 0 0] first when the block 0 copies fail. If block [1 0 0 0] is bad, block [0 1 0 0] will be picked, and so on.

In various embodiments, the process 500 may be implemented to minimize read disturb. Flash memory suffers from read disturb noise. When the number of reads on a block becomes large, the reliability of the cells in the block decreases and eventually leads to read errors. A frequently used method to handle read disturb in an SSD drive is to move the data to a new physical location when read disturb becomes severe. However, for the root record (and other system data that need to be stored in fixed locations), the block needs to be refreshed (e.g., erased and re-programmed with the same data).

Refreshing root record blocks is undesirable because: such erase/program operation increases the program and erase cycle count (PEC) and, therefore, flash wear, while the system should minimize PEC for root record blocks (and other system data blocks); and if a power failure happens during refreshing, the boot-up procedure after power is back on has one fewer root record block to rely upon, leading to a corner case of reduced reliability. Due to these considerations, read disturb for the root record blocks should be minimized. In various embodiments, the following points are followed to minimize read disturb for the root record blocks. The initial attempt on reading the root record is directed to a random location among all copies in all block-zeros. Since in most cases, the boot-up procedure will successfully load the root record in the first attempt, by randomly selecting the copy, the read disturb effects are spread out among different copies. Read retry is minimized. As previously mentioned, no soft read retry is involved. In the read policy described below in connection with FIG. 5, an optional hard-decision read retry is included, but is done only after all other retry attempts have failed. In addition, if any decoding retry procedures are included (e.g., for error floor mitigation), the read operation policy stores the raw codeword of the failed codeword in the buffer for retry purposes rather than re-reading the failed codeword from flash. Statistics on the root record collected during the boot-up procedure are saved and passed to the system. This avoids letting the system re-read the root record to find out such information. Examples of such statistics may include, but are not limited to: location of copies that were not read successfully and error count of the copy that was decoded successfully.

One problem with randomly picking a copy to read is that it makes it more likely that all copies fail at the same time due to the same amount of read disturb applied to blocks with similar PEC. To avoid the above problem, a non-uniform random number generator (RNG) is used in picking the copy to read. Without loss of generality, assuming there are 3 copies, the non-uniform RNG is designed to have probabilities a, b, and c to pick copy 1, 2, and 3, respectively. The probabilities a, b, and c can be chosen to be sufficiently different that the difference in read disturb will cause the more frequently read copy to fail before the less frequently read copy (e.g., a=2b=4c). Then copy 1 will have twice the amount of read disturb as copy 2, etc. Such a non-uniform RNG can be implemented with any known technology. In one example, the non-uniform RNG may be implemented using a modulus function on a uniform RNG, followed by mapping the remainder to the output based on a desired range of the non-uniform RNG.

Another consideration to take into account is that if read disturb is continuously biased towards one copy (e.g., copy 1), the block with that copy will get re-written faster/earlier than the blocks holding other copies. This gores against the principle of wear leveling and can lead to earlier-than-expected block failure. To avoid earlier-than-expected block failure, in some embodiments, the read policy "rotates" the non-uniform RNG among all copies whenever a re-writing occurs. An example of such a rotation is summarized in TABLE 2.

TABLE 2

| Non-uniform RNG, probability of picking each copy | Block/ copy 1 | Block/ copy 2 | Block/ copy 3 |
|---|---|---|---|
| Initial RNG | a | b | c |
| After rewriting (of copy 1) | c | a | b |
| After rewriting (of copy 2) | b | c | a |
| After rewriting (of copy 3) | a | b | c |
| . . . | | | |

Figure 5:
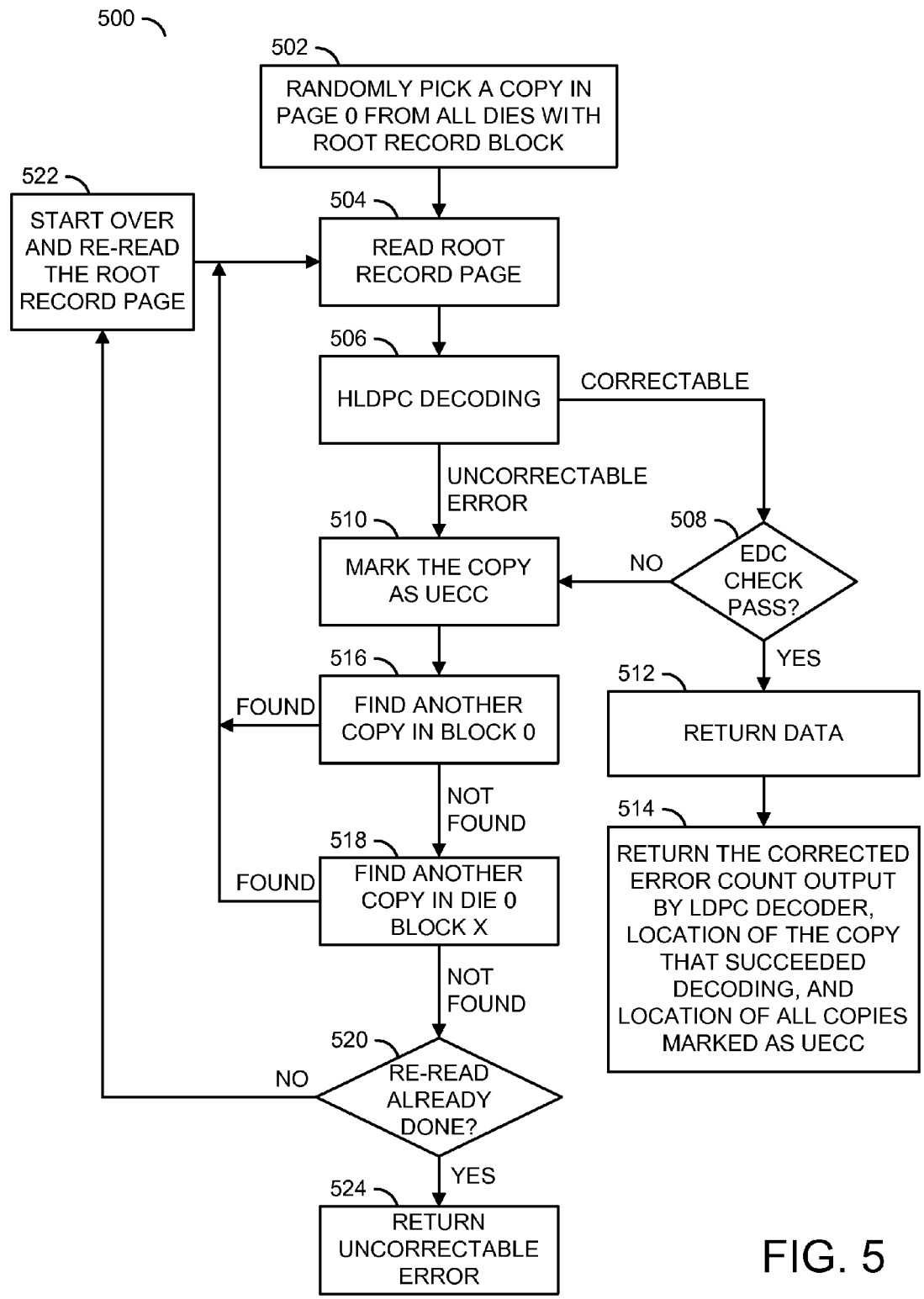
FIG. 5 is a flow diagram illustrating a process in accordance with an embodiment of the invention.

Referring to FIG. 5, a flow diagram of a process 500 is shown illustrating an example read operation policy in accordance with an embodiment of the invention. In various embodiments, the process (or method) 500 comprises a number of steps (or states) 502-524. In the step 502, a copy of the root record in page 0 in one of the dies containing a root record block is selected randomly. In a step 504, the selected root record page is read. In a step 506, HLDPC decoding is performed on the read page. If the decoding is successful (e.g., any errors were correctable) the process 500 moves to a step 508. Otherwise, the process 500 moves to a step 510. In the step 508, an error detection code (EDC) check is performed. If the EDC check is not passed, the process 500 moves to the step 510. When the EDC check is passed, the process 500 moves first to a step 512 where the data returned, then to a step 514 where the statistics (e.g., the corrected error count output by a LDPC decoder, location of the copy that succeeded being decoded, locations of copies marked as UECC, etc.) are returned. In the step 510, the copy is marked as having an uncorrectable error correction code (UECC). Once the failed copy is marked as UECC, the process 500 moves to a step 516 to find another copy of the root record in block 0 of the same die or of another die. If another root record is found, the process 500 returns to the step 504. If another root record is not found, the process 500 moves to a step 518 to find another copy of the root record using a die 0 block X. If a copy of the root record is found in a die 0 block X, the process 500 returns to the step 504. If a die 0 block X copy is not found, the process 500 moves to a step 520 where a check is made to determine whether a re-read operation has been done. If a re-read operation has not been done, the process 500 moves to a step 522 and the step 504 to start over and re-read the root record page. If a re-read operation has been done, the process 500 moves to the step 524 and returns an uncorrectable error status.

The process (or method) 500 generally illustrates an example embodiment. However, other variations may be implemented without departing from the intended scope of the invention. For example, the re-read step 522 before returning the uncorrectable error status (e.g., declaring failure) is optional. Another example is that if a latency budget allows, some simple decoding retry steps may be added after the trial on all copies in block X failed, such as re-decoding with a larger number of iterations.

The functions illustrated by the diagrams of FIGS. 1-5 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a plurality of memory dies; and
   a controller communicatively coupled to the plurality of memory dies and configured to utilize multiple copies of a root record containing system data during a boot-up process, wherein the multiple copies of the root record are stored using at least two of the plurality of memory dies, during the boot-up process, the controller is enabled to decode root record data stored in a particular location in a particular memory die of the plurality of memory dies and if decoding the root record data fails, the controller is enabled to decode a copy of the root record data stored in a different location in the particular memory die or in a particular location in at least one other memory die of the plurality of memory dies.

2. The apparatus according to claim 1, wherein the controller is configured to utilize three or more copies of the root record stored using two of the plurality of memory dies.

3. The apparatus according to claim 1, wherein the controller is configured to utilize three or more copies of the root record stored using three of the plurality of memory dies.

4. The apparatus according to claim 1, wherein the controller is configured to randomly select between the multiple copies of the root record for each boot-up.

5. The apparatus according to claim 4, wherein the controller is configured to make a non-uniform random selection between the multiple copies of the root record for each boot-up.

6. The apparatus according to claim 5, wherein the controller is configured to rotate the non-uniform random selection between the multiple copies of the root record.

7. The apparatus according to claim 6, wherein the controller is configured to rotate the non-uniform random selection among all copies whenever a root record is re-written.

8. The apparatus according to claim 1, wherein the controller is configured to maintain multiple copies of the root record using a pool of dedicated blocks in one of the plurality of dies.

9. The apparatus according to claim 8, wherein the pool of dedicated blocks is defined by a number of predetermined address bits.

10. The apparatus according to claim 1, wherein the controller is configured to minimize read disturb of the root record.

11. The apparatus according to claim 10, wherein the controller is configured to collect and save statistics on the root record during boot-up to minimize read disturb of the root record.

12. The apparatus according to claim 1, wherein the controller utilizes multiple copies of system data to mitigate an error floor of a hard-decision low density parity check code.

13. The apparatus according to claim 1, wherein:
during the boot-up process, the controller is enabled to perform a hard-decision decoding of the root record data.

14. The apparatus according to claim 1, wherein the controller comprises a read only memory (ROM) containing firmware for the boot-up process.

15. The apparatus according to claim 13, wherein the controller is configured to enable soft-decision decoding after the root record data is successfully read.

16. The apparatus according to claim 1, wherein the root record data comprises firmware specific to a type of the plurality of memory dies.

17. A method for implementing a system data read policy in a storage device comprising:
configuring a plurality of memory dies and a controller as a solid-state drive or disk (SSD);
storing multiple copies of a root record containing system data using at least two of the plurality of memory dies; and
configuring the controller to utilize the multiple copies of the root record during a boot-up process of the SSD, wherein, during the boot-up process, the controller is enabled to decode root record data stored in a particular location in a particular memory die of the plurality of memory dies and if decoding the root record data fails, the controller is enabled to decode a copy of the root record data stored in a different location in the particular memory die or in a particular location in at least one other memory die of the plurality of memory dies.

18. A storage controller comprising:
an interface circuit configured to communicatively couple the storage controller to a plurality of memory dies; and
a processor communicatively coupled to the interface circuit and configured to utilize multiple copies of a root record containing system data during a boot-up process, wherein the multiple copies of the root record are stored using at least two of the plurality of memory dies, during the boot-up process, the controller is enabled to decode root record data stored in a particular location in a particular memory die of the plurality of memory dies and if decoding the root record data fails, the controller is enabled to decode a copy of the root record data stored in a different location in the particular memory die or in a particular location in at least one other memory die of the plurality of memory dies.

19. The storage controller according to claim 18, wherein the multiple copies of the root record are stored in a block 0 of each of the at least two of the plurality of memory dies and at least one of a pool of predetermined non-zero blocks in at least one of the plurality of memory dies.

20. The storage controller according to claim 18, wherein during the boot-up process, the controller is enabled to perform a hard-decision decoding of the root record data.

* * * * *